(12) United States Patent
Pan

(10) Patent No.: US 6,340,627 B1
(45) Date of Patent: Jan. 22, 2002

(54) METHOD OF MAKING A DOPED SILICON DIFFUSION BARRIER REGION

(75) Inventor: Pai-Hung Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/597,064

(22) Filed: Jun. 19, 2000

Related U.S. Application Data

(63) Continuation of application No. 08/741,870, filed on Oct. 29, 1996, now Pat. No. 6,080,645.

(51) Int. Cl.7 .......................................... H01L 21/3205
(52) U.S. Cl. ..................... 438/585; 438/591; 438/592
(58) Field of Search ................................. 438/585, 591, 438/592

(56) References Cited

U.S. PATENT DOCUMENTS

| | | | |
|---|---|---|---|
| 4,755,865 A | 7/1988 | Wilson et al. | 357/63 |
| 4,774,204 A | 9/1988 | Havemann | 437/54 |
| 4,784,973 A | 11/1988 | Stevens et al. | 437/200 |
| 4,788,160 A | 11/1988 | Havemann et al. | 437/200 |

(List continued on next page.)

FOREIGN PATENT DOCUMENTS

EP 0746015 12/1996 ....... H01L/21/3065

OTHER PUBLICATIONS

Beyers, R., et al., "Titanium disilicide formation on heavily doped silicon substrates", *Journal of Applied Physics*, vol. 61, No. 11, 5110–5117, (Jun. 1, 1987).

Hosoya, T., et al., "A Polycide Gate Electrode with a Conductive Diffusion Barrier Formed with ECR Nitrogen Plasma for Dual Gate CMOS", *IEEE Transactions on Electron Devices*, 42, No. 12, pp. 2111–2116, (Dec. 1995).

Ito, T., et al., "A Nitride–Isolated Molybdenum–Polysilicon Gate Electrode for MOS VLSI Circuits", *IEEE Transactions on Electron Devices*, vol. ED–33, No. 4, 464–468, (Apr. 1986).

Kobushi, K., et al., "A High Integrity and Low Resistance Ti–Polycide Gate Using a Nitrogen Ion–Implanted Buffer Layer", *Japanese Journal of Applied Physics/Part 2: Letters*, 27, No. 11, pp. L2158–L2160, (Nov. 1988).

Pan, P., et al., "Highly Conductive Electrodes for CMOS", *Proc. of the international symposium on ULSI Sci & Tech*, ECS, Inc., Pennington, NJ, 104–109, (1989).

Shimizu, S., et al., "0.15um CMOS Process for High Performance and High Reliability", *IEEE*, pp. 4.1.1–4.1.4, (1994).

*Primary Examiner*—Jey Tsai
*Assistant Examiner*—Lynne Gurley
(74) *Attorney, Agent, or Firm*—Schwegman, Lundberg, Woessner & Kluth, P.A.

(57) ABSTRACT

Methods and apparatus for forming word line stacks are comprised of a silicon diffusion barrier region, doped with oxygen or nitrogen, coupled between a bottom silicon layer and a conductor layer. Word line stacks formed by the methods of the invention are used in sub-0.25 micron line width applications and have a lower resistivity and improved thermal stability.

25 Claims, 3 Drawing Sheets

U.S. PATENT DOCUMENTS

| | | |
|---|---|---|
| 4,897,368 A | 1/1990 | Kobushi et al. ............. 437/200 |
| 4,912,542 A | 3/1990 | Suguro ........................ 357/67 |
| 4,923,822 A | 5/1990 | Wang et al. .................. 437/41 |
| 4,935,804 A | 6/1990 | Ito et al. ....................... 357/71 |
| 5,210,043 A | 5/1993 | Hosaka ........................ 437/30 |
| 5,234,794 A | 8/1993 | Sebald et al. ............... 430/325 |
| 5,381,302 A | 1/1995 | Sandhu et al. .............. 361/305 |
| 5,395,787 A | 3/1995 | Lee et al. ...................... 437/57 |
| 5,397,744 A | 3/1995 | Sumi et al. ................. 437/200 |
| 5,534,713 A | 7/1996 | Ismail et al. .................. 257/24 |
| 5,541,131 A | 7/1996 | Yoo et al. ..................... 437/44 |
| 5,545,574 A | 8/1996 | Chen et al. ................... 437/40 |
| 5,545,581 A | 8/1996 | Armacost et al. ............. 437/52 |
| 5,569,947 A | 10/1996 | Iwasa et al. ................ 257/336 |
| 5,624,869 A | 4/1997 | Agnello et al. ............. 438/602 |
| 5,633,200 A | 5/1997 | Hu ............................... 438/653 |
| 5,650,648 A | 7/1997 | Kapoor ....................... 257/316 |
| 5,656,546 A | 8/1997 | Chen et al. ................. 438/586 |
| 5,665,646 A | 9/1997 | Kitano ........................ 438/592 |
| 5,668,394 A | 9/1997 | Lur et al. .................... 257/413 |
| 5,682,055 A | 10/1997 | Huang et al. ................ 257/408 |
| 5,710,438 A | 1/1998 | Oda et al. ...................... 257/69 |
| 5,723,893 A | 3/1998 | Yu et al. ..................... 257/413 |
| 5,726,479 A | 3/1998 | Matsumoto et al. ......... 257/412 |
| 5,728,625 A | 3/1998 | Tung .......................... 438/586 |
| 5,739,064 A | 4/1998 | Hu et al. ..................... 438/528 |
| 5,796,151 A | 8/1998 | Hsu et al. .................... 257/410 |
| 5,856,698 A | 1/1999 | Hu et al. ..................... 257/412 |
| 5,874,351 A | 2/1999 | Hu et al. ..................... 438/527 |
| 5,874,353 A | 2/1999 | Lin et al. .................... 438/592 |
| 5,945,719 A | 8/1999 | Tsuda ......................... 257/413 |

METHOD OF MAKING A DOPED SILICON DIFFUSION BARRIER REGION

This application is a Continuation of U.S. Ser. No. 08/741,870, filed Oct. 29, 1996. now U.S. Pat. No. 6,080,645.

FIELD OF THE INVENTION

The present invention relates to the manufacture of semiconductor devices, and in particular, to the manufacture of gate structures utilized in advanced semiconductor products, having a doped silicon diffusion barrier region.

BACKGROUND

Semiconductor memory devices are comprised of an array of memory cells. Each memory cell is comprised of a capacitor, on which the charge stored represents the logical state of the memory cell. A charged capacitor corresponds to a logical state of "1" and an uncharged capacitor corresponds to a logical state of "0." Word lines activate access transistors, so that the logical state of a memory cell can be read. Gates of multiple transistors are formed as one word line.

An example of a word line's application is in a dynamic random access memory (DRAM). In a DRAM, a common word line, used to access memory cells, is fabricated on a p-type silicon substrate coated with a thin film of silicon dioxide ($SiO_2$), known as gate oxide. Then, a word line is formed on the gate oxide layer as a two-layer stack, comprising silicon (or polysilicon), coated with a conductor material. The most common two-layer stack used in the industry is a layer of polysilicon, coated with a tungsten silicide layer. Tungsten silicide is used because of its good integration properties, such as providing good thermal stability, stability during source/drain oxidation, and stability during dry etching, as well as having a low resistivity. Although titanium silicide is approximately 75% less resistive than tungsten silicide, it has not been used extensively in two-layer stacks because it is not as thermally stable. Titanium silicide tends to agglomerate during subsequent high temperature processing steps. Alternatively, a metal is used instead of a silicide for the conductor layer.

Of primary concern is minimizing resistivity throughout the word line, due to the need to reduce RC time constants and access multiple memory cells in as short a period of time as possible. The problem is especially critical due to the extended length of word lines. Diffusion of silicon from the bottom polysilicon layer to the top conductor layer increases the resistivity of the two-layer stack. When silicon diffuses through the stack, it reacts with the conductor layer elements, increasing the resistivity of the conductor layer. When the conductor layer is formed of a metal, silicides are formed, which have a higher resistivity than pure metal.

One previous unsuccessful attempt to solve this diffusion problem introduces a third layer, which acts as a diffusion barrier, between the silicon and conductor layers. For example, a silicon nitride layer is used as the third layer in a two-layer stack. However, the silicon nitride diffusion barrier layer of Ito et al. (IEEE Transactions on Electron Devices, ED-33 (1986), 464 and U.S. Pat. No. 4,935,804) is difficult to employ because it must be ultrathin (less than 3 nanometers thick) to allow tunneling of charges through the layer, yet thick enough to act as a reaction barrier between the polysilicon and conductor layer elements.

Another diffusion barrier used in the past is comprised of a titanium nitride layer interposed between a two-layer stack. The conductive titanium nitride barrier layer of Pan et al. (IBM General Technology Division, "Highly Conductive Electrodes for CMOS") attempts to solve the problems of Ito et al., but it requires a special source/drain (S/D) oxidation process when forming oxide spacers to maintain gate oxide layer integrity. A special process is required due to the tendency for tungsten and titanium nitride to oxidize, resulting in degradation of these layers. This adds time and cost to the fabrication process.

In ultra large scale integrated (ULSI) circuits, a highly conductive word line is necessary to improve circuit density and performance. In order to maintain a highly conductive word line, it is necessary to provide an effective method for decreasing diffusion within the two-layer stack. As devices are scaled down in size, word line widths are also decreased. While smaller line widths result in a decreased amount of resistance, this decrease is more than offset by an increase resistance due to the longer length of word lines. To date, word line resistance is one of the primary limitations of achieving faster ULSI circuits. A method for decreasing the resistivity of word lines is needed for use in ULSI applications.

In addition to creating a diffusion barrier layer in a two-layer word line stack, another way of decreasing resistance in a word line is by forming a high conductivity film on the word line. Such films are commonly formed of a refractory metal silicide, such as titanium silicide ($TiSi_2$). Titanium is preferably used as the refractory metal component because it has the ability to reduce oxygen, which remains on surfaces in the form of native oxides. Native oxides are reduced to titanium oxide by titanium. Native oxides degrade interface stability, and often cause device failure if not removed.

Due to the increased sensitivity of ULSI circuits, it is important to maintain low resistivity in ULSI devices. There is a need for a method of preventing diffusion between the two layers in a semiconductor word line stack, in order to prevent a reduction in the conductivity in the word line stack. The method for decreasing such diffusion preferably should be compatible with other ways of decreasing resistivity in a word line stack.

SUMMARY OF THE INVENTION

A method for forming a word line, which is used in ultra-large scale integrated (ULSI) circuits, produces a lower resistivity word line than that formed using prior art techniques. A doped silicon diffusion barrier formed in the word line stack prevents diffusion from a bottom silicon layer to a conductor layer in a word line stack, which results in degradation of the word line stack, increasing its resistivity. Oxygen or nitrogen is used for the dopant. Compared to dielectric diffusion barriers, oxygen or nitrogen doped silicon has a significantly lower resistance. Furthermore, such dopants improve the thermal stability of the conductor layer.

DETAILED DESCRIPTION

A word line is formed for use in ultra-large scale integrated (ULSI) circuits. While the invention is described with reference to it being a word line, other conductors may also be formed for various purposes, especially where reduced resistance is needed. The forming of diffusion barriers using oxygen or nitrogen in a word line stack is used to prevent diffusion from a bottom silicon layer to a conductor layer.

Doped Silicon Diffusion Barrier

Figure 1A:
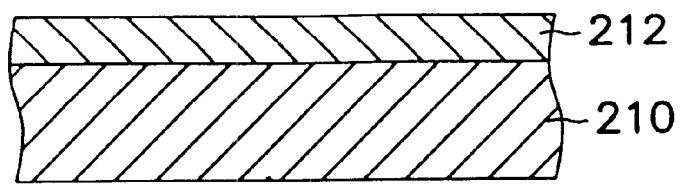
FIGS. 1A to 1G are cross-sectional representations of a word line stack formed in accordance with the method of the invention.
Figure 1B:
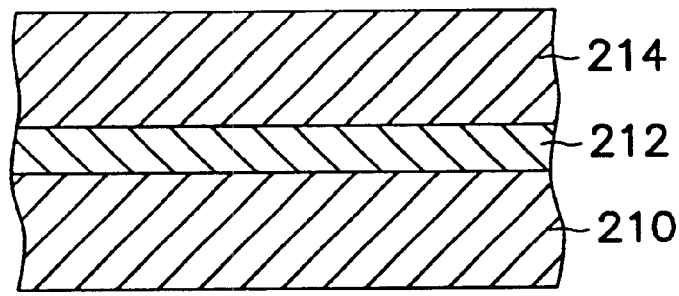

According to one aspect of the invention, a doped silicon diffusion barrier region is formed prior to formation of a conductor layer, and subsequent to formation of a bottom silicon layer, to form a word line stack. In a first embodiment of the invention, a conventional p-type silicon substrate 210 is provided and a conventional (i.e., a thin layer of $SiO_2$) gate oxide layer 212 is grown by standard techniques, as shown in FIG. 1A. After gate oxide 212 growth, a polysilicon (or amorphous silicon) "bottom silicon" layer 214 of thickness from approximately 50 to 300 nanometers is deposited on the gate oxide layer 212, as shown in FIG. 1B. This bottom silicon layer 214 is doped with conventional dopants (such as, but not limited to, arsenic, phosphorous, and boron), or it can be a layer of undoped, intrinsic material. Regardless of composition, the bottom silicon layer 214 is manufactured according to known techniques in order to guarantee good electrical properties at the interface between the gate oxide layer 212 and the bottom silicon layer 214.

Figure 1C:
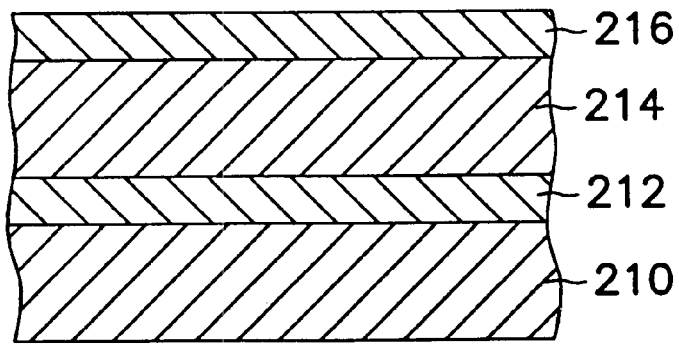

Next, a thin layer 216 of oxygen, or nitrogen, doped polysilicon (or amorphous silicon) material is formed on the bottom layer 214, as shown in FIG. 1C. This "doped silicon" film 216 is formed in one of two ways. The first way is by deposition (either in-situ or non-in-situ), using chemical vapor deposition (CVD). CVD takes on many different forms, including low pressure chemical vapor deposition (LPCVD), ambient pressure chemical vapor deposition (APCVD), and plasma enhanced chemical vapor deposition (PECVD). However, any form of CVD or sputtering can be used. The second way to form the "doped silicon film" 216 is by implantation of oxygen or nitrogen into the exposed surface of the bottom silicon layer 214 to form oxygen-doped or nitrogen-doped polysilicon or oxygen-doped or nitrogen-doped amorphous silicon.

The interface between the bottom silicon layer 214 and the doped silicon layer 216 can be abrupt, or gradual, with respect to the oxygen, or nitrogen, distribution, as shown in FIG. 1C. The thickness of the doped silicon layer 216 ranges from approximately 5 to 100 nanometers, and the concentration of oxygen, or nitrogen, ranges from between approximately $1\times10^{17}$ atoms/cm$^3$ to $5\times10^{21}$ atoms/cm$^3$. However, the required doped silicon layer 216 thickness and dopant concentration depend on the total thermal budget of subsequent processes, and are selected according to known principles.

Figure 1D:
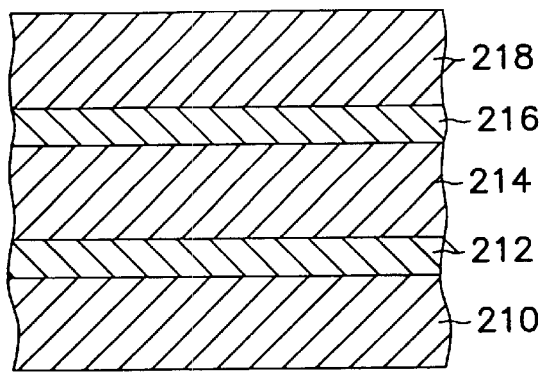

Then, as shown in FIG. 1D, a conductor layer 218 (preferably, but not necessarily, composed of tungsten, titanium silicide (TiSi$_x$), or other conventional materials) of between approximately 50 to 200 nanometers thick is deposited on the doped silicon layer 216 by conventional techniques, such as sputtering, or CVD. If an intrinsic bottom silicon layer 214 of polysilicon is used, ion implantation of arsenic, phosphorous, or boron is performed after creation of the bottom silicon layer 214, after creation of the doped silicon layer 216, or after creation of the conductive layer 218.

The presence of oxygen, or nitrogen, doped polysilicon inhibits silicon diffusion from the bottom polysilicon layer 214 to the conductor layer 218. Furthermore, it improves the thermal stability of the conductor film 218. Compared to a polysilicon film that is not doped with oxygen or nitrogen, the oxygen or nitrogen-doped polysilicon film 216 has a higher resistance value. However, compared to a dielectric film, the oxygen or nitrogen doped polysilicon film 216 has a significantly lower resistance, and thus provides good electrical conduction between the conductive layer 218 and the bottom polysilicon layer 214.

Figure 1E:
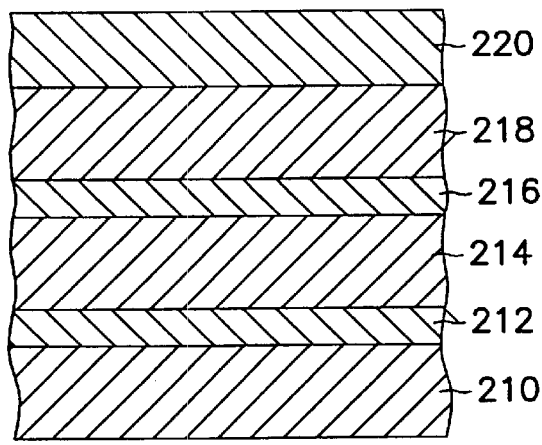
Figure 1F:
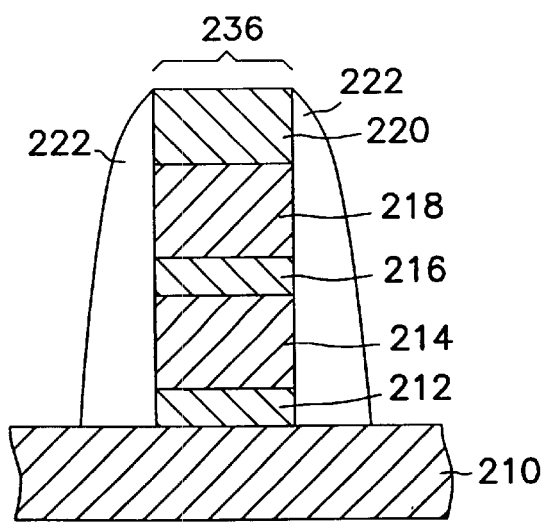
Figure 1G:
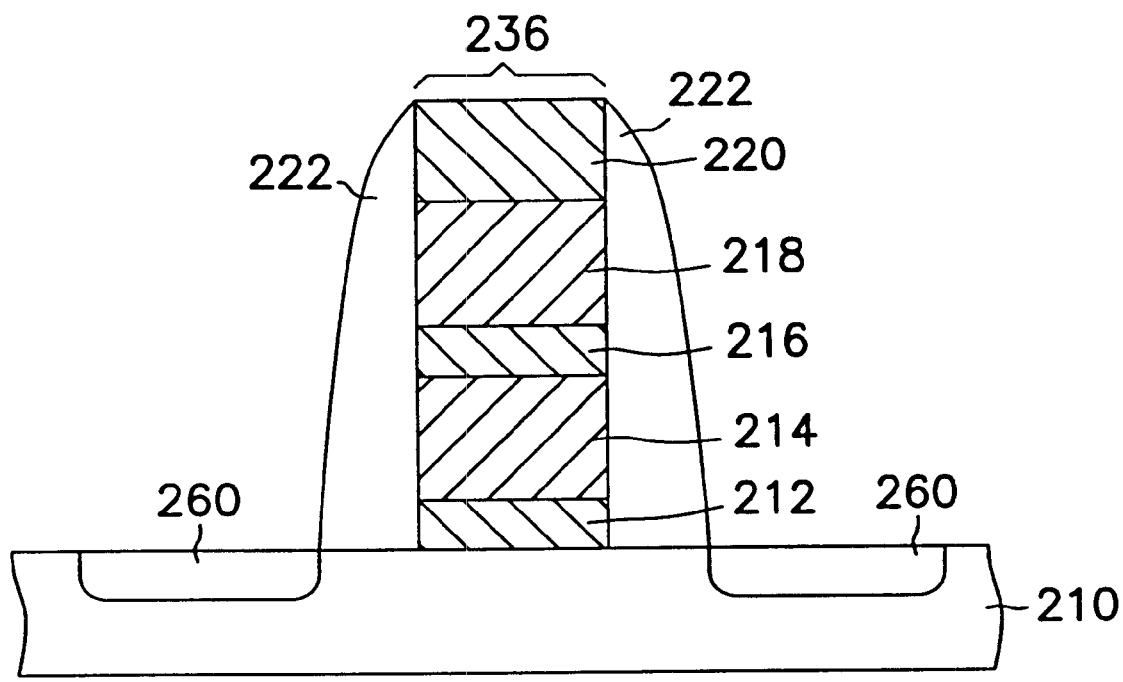

Finally, a cap 220 of one or more dielectric materials, such as silicon oxide or silicon nitride, is formed, if needed, according to conventional techniques, as shown in FIG. 1E. Conventional photo mask and dry etch processes then define a word line stack. After wafer cleaning, spacers 222 are formed alongside the word line stack 236, as shown in FIG. 1F. Then, source/drain (S/D) implantation forms doped S/D regions 260 aligned with the spacers 222, as shown in FIG. 1G.

The resultant word line structure is comprised of: a conductor layer 218; an oxygen or nitrogen, doped polysilicon (or amorphous silicon) region 216; and a polysilicon (or amorphous silicon) layer 214, as shown in FIGS. 1A to 1G. The conductor layer 218 provides low resistivity. The oxygen, or nitrogen, doped region 216 eliminates (or reduces) agglomeration of the C54-TiSi$_2$ high temperature phase at interfaces between the low temperature C49-TiSi$_2$ 218 and polysilicon (or amorphous silicon) 214 during subsequent process heat cycles. The bottom polysilicon (or amorphous silicon) layer 214 provides stable gate oxide interface electrical properties.

Conclusion

Numerous further embodiments will be apparent to one skilled in the art. Different embodiments of the invention can be applied simultaneously to further decrease the resistivity of a word line. The above described embodiments are examples only, and are not meant to be read in a limiting sense. While the invention has been described for use in the formation of low resistivity word line structures, other conductive structures, such as column lines or other conductors between components on a chip may be formed using the invention.

What is claimed is:

1. A method of manufacturing a sub-0.25 micron semiconductor device on a semiconductor layer; comprising:
   forming an oxide layer over the semiconductor layer;
   forming a silicon layer over the oxide layer;
   forming a doped silicon diffusion barrier region in the silicon layer having low electrical resistance by introducing into the silicon layer at least one dopant selected from the group consisting of:
   (1) oxygen, and
   (2) nitrogen; and forming a conductor layer directly on the diffusion barrier region.

2. The method of claim 1, wherein the semiconductor device is a sub-0.25 micron word line stack, utilized in a dynamic random access memory (DRAM) and the semiconductor layer comprises silicon.

3. The method of claim 1, wherein the silicon layer is selected from the group consisting of: intrinsic polysilicon, intrinsic amorphous silicon, doped amorphous silicon, and doped polysilicon.

4. The method of claim1, wherein the silicon layer is selected from the group consisting of intrinsic polysilicon and intrinsic amorphous silicon, and further comprising implanting an ion into the silicon layer, wherein the ion is selected from the group consisting of: arsenic, phosphorous, and boron.

5. The method of claim 4, wherein the implanting is performed at a time selected from the following times: after forming the silicon layer, prior to forming the diffusion barrier region; after forming the diffusion barrier region, prior to forming the conductor layer; and after forming the conductor layer.

6. The method of claim 1, wherein the silicon layer has a thickness of approximately 50 to 300 nanometers.

7. The method of claim 1, wherein the conductor layer comprises titanium silicide and has a thickness of approximately 50 to 200 nanometers.

8. The method of claim 1, wherein the diffusion barrier region has a thickness of approximately 5 to 100 nanometers and the dopant introduced into the diffusion barrier region has a concentration of approximately $1 \times 10^{17}$ to $5 \times 10^{21}$ atoms/cm$^3$.

9. The method of claim 8, wherein the conductor layer comprises titanium silicide and has a thickness of approximately 50 to 200 nanometers.

10. A method of manufacturing a semiconductor device on a semiconductor layer, comprising:

forming an oxide layer over the semiconductor layer;

forming a silicon layer consisting of intrinsic polysilicon or intrinsic amorphous silicon over the oxide layer;

implanting an ion into the silicon layer, wherein the ion is selected from the group consisting of: arsenic, phosphorous, and boron;

forming a doped silicon diffusion barrier region in the silicon layer having low electrical resistance by introducing into the silicon layer at least one dopant selected from the group consisting of:
(1) oxygen, and
(2) nitrogen; and forming a conductor layer directly on the diffusion barrier region.

11. The method of claim 10, wherein the semiconductor device is a sub-0.25 micron word line stack, utilized in a dynamic random access memory (DRAM) and the semiconductor layer comprises silicon.

12. The method of claim 10, wherein the implanting is performed at a time selected from the following times: after forming the silicon layer, prior to forming the diffusion barrier region; after forming the diffusion barrier region, prior to forming the conductor layer; and after forming the conductor layer.

13. The method of claim 10, wherein the silicon layer has a thickness of approximately 50 to 300 nanometers.

14. The method of claim 10, wherein the conductor layer comprises titanium silicide and has a thickness of approximately 50 to 200 nanometers.

15. A method of manufacturing a semiconductor device on a semiconductor layer, comprising:

forming an oxide layer over the semiconductor layer;

forming a silicon layer to a thickness of approximately 50 to 300 nanometers over the oxide layer;

forming a doped silicon diffusion barrier region in the silicon layer having low electrical resistance by introducing into the silicon layer at least one dopant selected from the group consisting of:
(1) oxygen, and
(2) nitrogen; and forming a titanium silicide layer directly as the diffusion barrier region.

16. The method of claim 15, wherein forming the titanium silicide layer includes forming the titanium silicide layer to a thickness of approximately 50 to 200 nanometers.

17. The method of claim 15, wherein forming the diffusion barrier region includes forming the diffusion barrier to a thickness of approximately 5 to 100 nanometers and introducing the dopant into the silicon layer such that the diffusion barrier has a concentration of approximately $1 \times 10^{17}$ to $5 \times 10^{21}$ atoms/cm$^3$.

18. The method of manufacturing a sub-0.25 micron word line stack on a semiconductor layer, comprising:

forming an oxide later over the semiconductor layer;

forming a silicon layer over the oxide layer, wherein the silicon layer is selected from the group consisting of: intrinsic polysilicon and intrinsic amorphous silicon;

implanting an ion into the silicon layer, wherein the ion is selected from the group consisting of: arsenic, phosphorous, and boron;

forming a doped silicon diffusion barrier region in the silicon layer and having low electrical resistance by introducing into the silicon layer at least one dopant selected from the group consisting of:
(1) oxygen, and
(2) nitrogen;

wherein the diffusion barrier region has a thickness of approximately 5 to 100 nanometers; and forming a titanium silicide layer directly on the diffusion barrier region.

19. The method of claim 18, wherein introducing the dopant into the silicon layer includes forming the diffusion barrier region to have a dopant concentration of approximately $1 \times 10^{17}$ to $5 \times 10^{21}$ atoms/cm$^3$.

20. The method of claim 18, wherein forming the titanium silicide layer includes forming the titanium silicide layer to a thickness of approximately 50 to 200 nanometers.

21. A method of manufacturing a semiconductor device on a semiconductor layer, comprising:

forming an oxide layer over the semiconductor layer;

forming a silicon layer over the oxide layer;

forming a doped silicon diffusion barrier region in the silicon layer having low electrical resistance by introducing into the silicon layer at least one dopant selected from the group consisting of oxygen and nitrogen, wherein the dopant introduced into the diffusion barrier region has a concentration of approximately $1 \times 10^{17}$ to $5 \times 10^{21}$ atoms/cm$^3$; and 22. The method of claim 21, wherein the silicon layer has a thickness of approximately 50 to 300 nanometers.

23. The method of claim 22, wherein the conductor layer comprises titanium silicide and has a thickness of approximately 50 to 200 nanometers.

24. The method of claim 22, wherein the diffusion barrier region has a thickness of approximately 5 to 100 nanometers.

25. The method of claim 21, wherein the implanting is performed at a time selected from the following times: after forming the silicon layer, prior to forming the diffusion barrier region; after forming the diffusion barrier region, prior to forming the conductor layer; and afte forming the conductor layer.

* * * * *

UNITED STATES PATENT AND TRADEMARK OFFICE
CERTIFICATE OF CORRECTION

PATENT NO. : 6,340,627 B1
DATED : January 22, 2002
INVENTOR(S) : Pan

It is certified that error appears in the above-identified patent and that said Letters Patent is hereby corrected as shown below:

Column 5,
Line 59, delete "as" and insert -- on --, therefor.

Column 6,
Line 46, insert -- forming a conductor layer directly on the diffusion barrier region --, therefor after "; and".

Signed and Sealed this

Sixth Day of August, 2002

Attest:

Attesting Officer

JAMES E. ROGAN
Director of the United States Patent and Trademark Office